United States Patent [19]

Ogura

[11] Patent Number: 5,751,047

[45] Date of Patent: May 12, 1998

[54] SEMICONDUCTOR CIRCUIT WITH REDUCED P-N JUNCTION CAPACITANCE

[75] Inventor: Kiyonori Ogura, Kasugai, Japan

[73] Assignee: Fujitsu Limited, Kanagawa, Japan

[21] Appl. No.: 630,851

[22] Filed: Apr. 11, 1996

[30] Foreign Application Priority Data

Sep. 14, 1995 [JP] Japan ................... 7-237241

[51] Int. Cl.[6] .............................. H01L 29/68
[52] U.S. Cl. ................ 257/394; 257/398; 257/399; 257/400
[58] Field of Search ....................... 257/391, 392, 257/394, 395, 396, 398, 399, 400, 386

[56] References Cited

U.S. PATENT DOCUMENTS

| | | | |
|---|---|---|---|
| 4,700,212 | 10/1987 | Okazawa | 257/398 |
| 4,889,820 | 12/1989 | Mori | 437/29 |
| 5,169,792 | 12/1992 | Katoh et al. | 257/398 |

FOREIGN PATENT DOCUMENTS 1-99251  4/1989  Japan ................... 257/391

*Primary Examiner*—Donald Monin
*Attorney, Agent, or Firm*—Armstrong, Westerman, Hattori, McLeland & Naughton

[57] ABSTRACT

The semiconductor device according to the present invention includes a semiconductor substrate of a first conductive type. A well area of the first conductive type is formed in the substrate. The well area has higher concentration of impurity than that of the substrate. The well area includes a first element. The first element is of a second conductive type different from the first conductive type. A second element of the second conductive type formed in the substrate. The first element is isolated from the second element by a field oxide.

5 Claims, 6 Drawing Sheets

SEMICONDUCTOR CIRCUIT WITH REDUCED P-N JUNCTION CAPACITANCE

BACKGROUND OF THE INVENTION

1. Field of the Invention

The present invention relates generally to a semiconductor device, and more particularly, to a reduction of p-n junction capacitance in a MOS transistor and in circuits having a similar structure to a MOS transistor.

2. Description of the Related Art

There has been an increasing demand for higher operating speed and greater memory capacity of computer systems. A great number of semiconductor devices are often mounted on a single circuit board in order to enlarge the memory capacity. The input-output circuits of these semiconductor devices (e.g., address buffers) are coupled to each other via the same bus signal lines. Among the approaches for accelerating the operating speed of the computer system is to reduce the load capacitance of the input-output circuits coupled to the bus signal lines.

FIGS. 1A and 1B show a protective circuit formed in an input circuit section of a conventional semiconductor device. The protective circuit 61 prevents high voltage static electricity from damaging the semiconductor device. As shown in FIG. 1B, a p⁻ type well diffusion area 63 is formed in a p⁻⁻ type semiconductor substrate 62. A pair of n⁺ type diffusion areas 64 and 65 are formed in the p⁻ type well diffusion area 63. The n⁺ type diffusion areas 64 and 65 are isolated from each other by a field oxide film 66 formed on the surface of the p⁻ type well diffusion area 63. The n⁺ type diffusion areas 64 and 65, together with part of the field oxide film 66 therebetween, have the almost same structure with the structure of an nMOS transistor. That is, forming a gate between the diffusion areas 64 and 65, instead of the field oxide 66, may realize an nMOS transistor. In this case, the n⁺ type diffusion areas 64 and 65 may serve as a source and drain, respectively. Insulation 67 is formed on the surface of the semiconductor device.

The semiconductor device has an aluminum wiring 68 coupled to external input terminals (not shown) to transmit signals from the terminals to the n⁺ type diffusion area 65 with a contact 69. The semiconductor device has an aluminum wiring 70 coupled to the low voltage grounding line (not shown). The wiring 70 is also coupled to the n⁺ type diffusion area 64 with a contact 71. As shown in FIG. 1A, an aluminum wiring 72, designed to transmit signals to the input circuit (not shown), is also provided in the device. The wiring 72 is coupled to the n⁺ type diffusion area 65 with a contact 73.

In the protective circuit 61, signals at normal voltage, when input to the external input terminal, is transmitted to the n⁺ type diffusion area 65 via the aluminum wiring 68. The signal is then transmitted to the input circuit from the area 65 via the aluminum wiring 72. Even when positive static electricity occurs at the external input terminal, the input circuit is protected by the protective circuit 61, which operates in the manner described in detail below. The positive static electricity, when transmitted to the n⁺ type diffusion area 65 from the external input terminal via the aluminum wiring 68, causes a breakdown of the p-n junction of the n⁺ type diffusion area 65 and the p⁻ type well diffusion area 63. The breakdown passes a current from the n⁺ type diffusion area 65 to ⁻ the type well diffusion area 63. Since the junction from the p⁻ type well diffusion area 63 to the n⁺ type diffusion area 64 is a forward p-n junction, the current is passed from the area 63 to the area 64. The current then escapes to the low voltage line via the aluminum wiring 70.

FIG. 2 shows a conventional CMOS semiconductor device 75. A p⁻ type well diffusion area 63 is formed in a p⁻⁻ type semiconductor substrate 62. Formed on and in the ⁻ type well diffusion area 63 are an nMOS transistor 76 consisting of a gate 77 and a pair of n⁺ type diffusion areas 78 and 79, and an nMOS transistor 80 consisting of a gate 81 and a pair of n⁺ type diffusion areas 82 and 83. The nMOS transistors 76 and 80 are isolated from each other by the field oxide film 66 formed on the p⁻⁻ type semiconductor substrate 62. An n⁻ type well diffusion area 85 is formed in the p⁻⁻ type semiconductor substrate 62. A pMOS transistor 86 consisting of a gate 87 and a pair of p⁺ type diffusion areas 88 and 89 is formed on and in the n⁻ type well diffusion area 85. In FIG. 2, insulation formed on the surface of the semiconductor device 75 is not illustrated.

In the conventional semiconductor device 75, both of the nMOS transistors 76 and 80 are formed in the single p⁻ type well diffusion area 63. This structure allows the threshold voltage of the transistors 76 and 80 to be controlled accurately.

In order to reduce the capacitance of the protective circuit 61 shown in FIGS. 1A and 1B, the junction capacitance of the n⁺ type diffusion area 65 and p⁻ type well diffusion area 63 should be reduced. One of the approaches to reduce the capacitance is to reduce the junction area (more specifically, the length of the junction) of the n⁺ type diffusion area 65 and p⁻ type well diffusion area 63. However, the reduction of the junction area of the n⁺ type diffusion area 65 and the p⁻ type well diffusion area 63 lowers the conductance, i.e., the capability for passing current through the junction. This makes it difficult to leak high-voltage static electricity from the external input terminal to the low voltage line. Accordingly the tolerance of the semiconductor device against static electricity is reduced.

In order to accelerate the operating speed of the semiconductor device 75 illustrated in FIG. 2, it is required to reduce the junction capacitance of n⁺ type diffusion areas 78, 79, 82 and 83, and the p⁻ type well diffusion area 63 in nMOS transistors 76 and 80, and it is also required to reduce the junction capacitance of p⁺ type diffusion areas 88 and 89, and n⁻ type well diffusion area 85 in the pMOS transistor 86. In other words, the aforementioned junction areas (more specifically, the length of the junction) need to be reduced. The reduction of the junction areas, however, lowers the conductance of the transistors 76, 80 and 86. This degrades the load driving performance of the transistors (capability for passing current) and thus fails to accelerate the operating speed of the semiconductor device 75.

SUMMARY OF THE INVENTION

Broadly speaking, the present invention relates to a semiconductor device which allows the junction capacitance of an element formed therein to be reduced without degrading the conductance of the element.

The semiconductor device according to the present invention includes a semiconductor substrate of a first conductive type. A well area of the first conductive type is formed in the substrate. The well area has higher concentration of impurity than that of the substrate. The well area includes a first element. The first element is of a second conductive type different from the first conductive type. A second element of the second conductive type formed in the substrate. The first element is isolated from the second element by a field oxide.

Other aspects and advantages of the invention will become apparent from the following detailed description, taken in conjunction with the accompanying drawings, illustrating by way of example the principals of the invention.

BRIEF DESCRIPTION OF THE DRAWINGS

The invention, together objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1A:
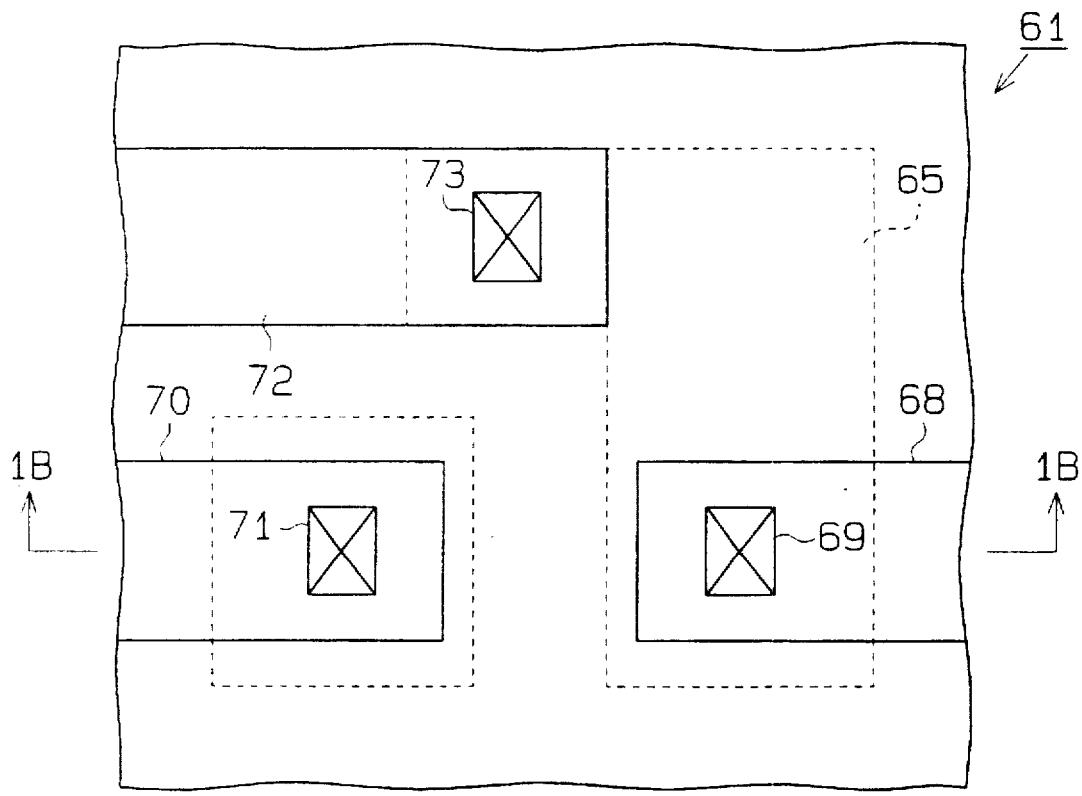
FIG. 1A is a plan view showing a protective circuit formed in an input circuit section of a conventional semiconductor device.
Figure 1B:
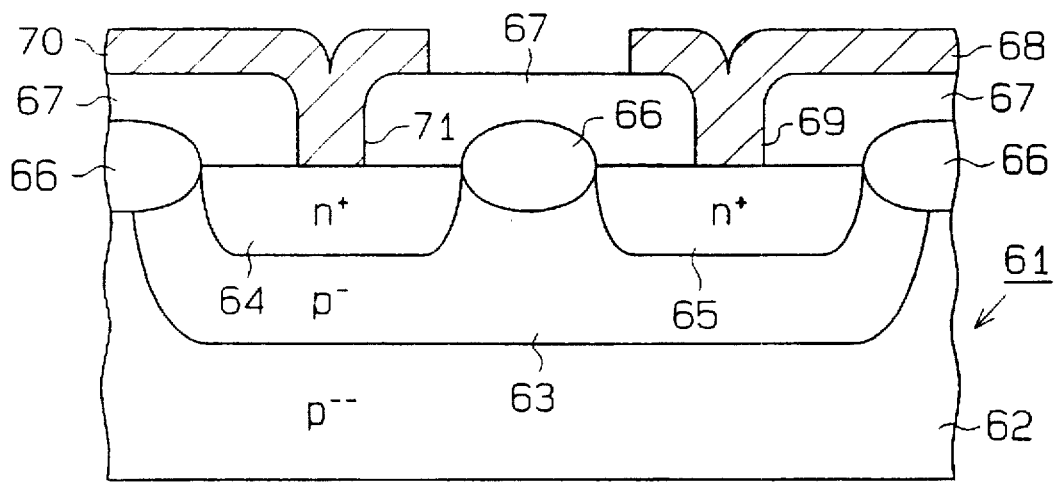
FIG. 1B is a cross-sectional view taken along line 1B—1B of FIG. 1A.
Figure 2:
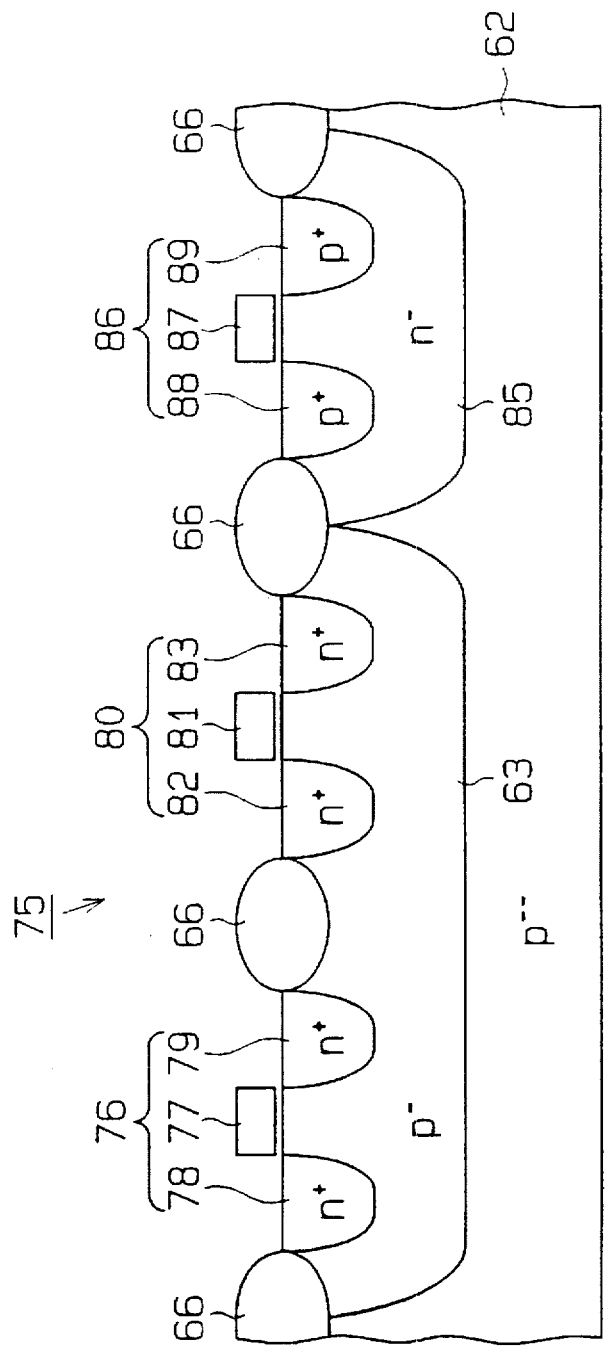
FIG. 2 is a cross-sectional view showing a conventional semiconductor device.

A protective circuit formed in an input circuit of a semiconductor device according to the first embodiment of the present invention will now be described referring to FIGS. 3A and 3B. As shown in FIG. 3B, a $p^-$ type semiconductor substrate 2 is provided as the semiconductor substrate of a first conductive type. A $p^-$ type well diffusion area 3 as the well diffusion area of the first conductive type is formed in the substrate 2. The concentration of p type impurity in the well diffusion area 3 is higher than the concentration of p type impurity in the semiconductor substrate 2.

An $n^+$ type diffusion area 4 is formed in part of the $p^-$ type well diffusion area 3, while an $n^+$ type diffusion area 5 is formed in the semiconductor substrate 2. The area 4 serves as the first element of a second conductive type. The area 5 serves as the second element of the second conductive type.

The diffusion areas 4 and 5 are isolated from each other by a field oxide film 6 formed on the surface of the substrate 2. Insulation 7 is formed on the surface of the semiconductor device. The vertical boundary B1 between the $p^-$ type well diffusion area 3 and $p^-$ type semiconductor substrate 2 is located close to the area 4 below the field oxide 6.

Figure 3A:
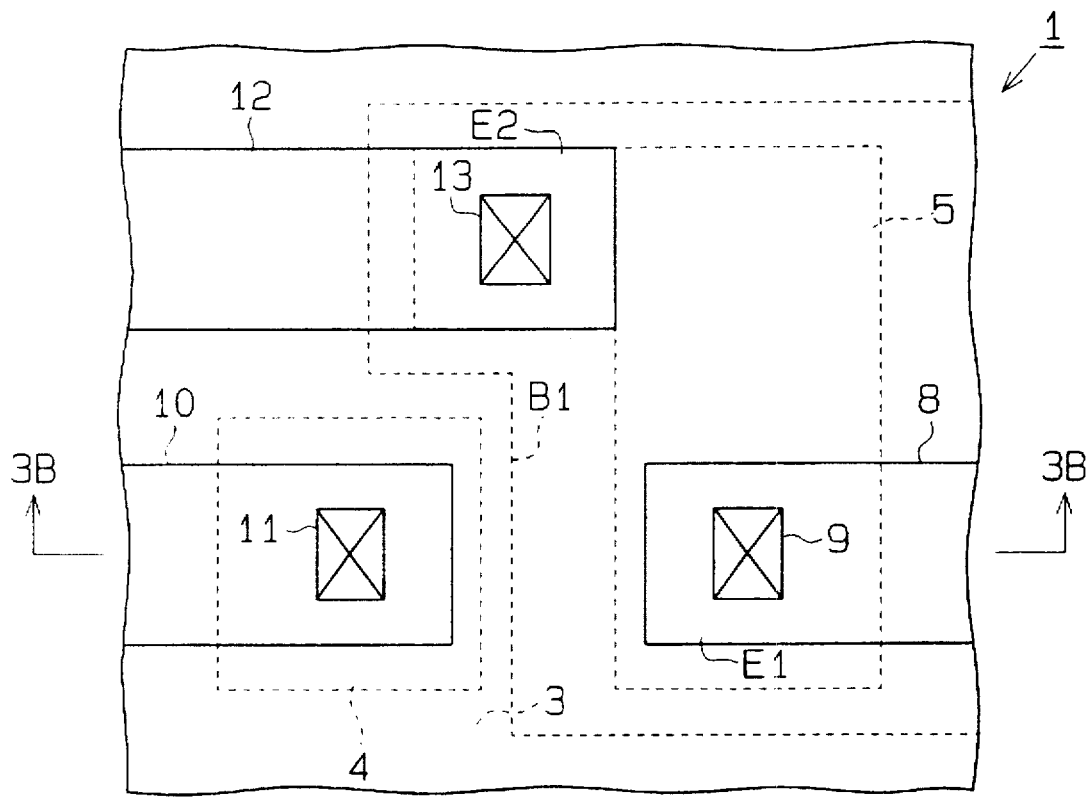
FIG. 3A is a plan view showing a protective circuit, formed in an input circuit of a semiconductor device according to a first embodiment of the present invention.
Figure 3B:
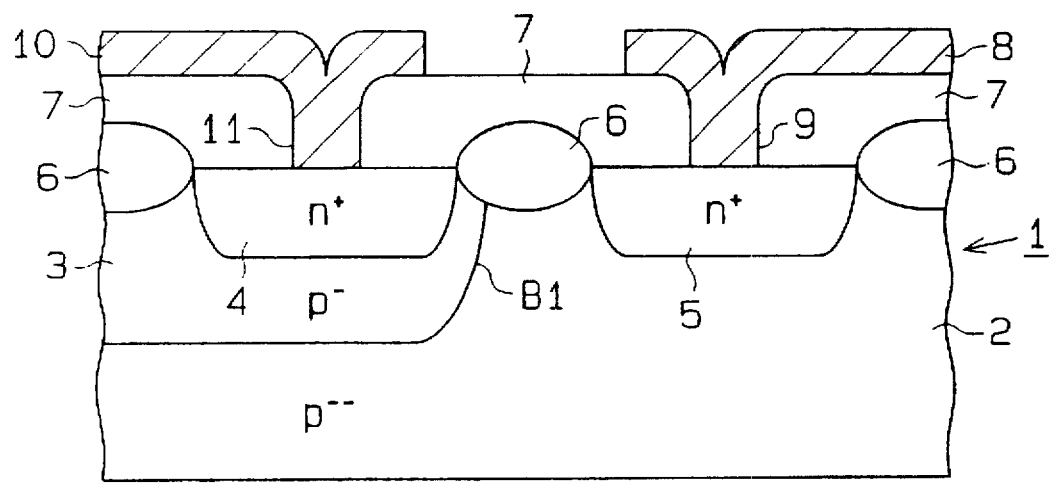
FIG. 3B is a cross-sectional view taken along line 3B—3B of FIG. 3A.

As shown in FIG. 3A, the $n^+$ type diffusion area 5 has first and second ends E1 and E2. The first end E1 of the area 5 is coupled, with a contact 9, to an aluminum wiring 8 passing signals from the external input terminal (not shown), while the second end E2 of the area 5 is coupled, with a contact 13, to an aluminum wiring 12 passing signals to the input circuit (not shown). The $n^+$ type diffusion area 5 and the $p^-$ type semiconductor substrate 2 form a p-n junction diode for protecting the input circuit. The $n^+$ type diffusion area 4 is coupled, with a contact 11, to an aluminum wiring 10. The wiring 10 is coupled to the low voltage grounding line (not shown).

In the protective circuit 1, signals at normal voltage, when input to the external input terminal, is transmitted to the $n^+$ type diffusion area 5 via the aluminum wiring 8 and the contact 9. The signal is then transmitted to the input circuit (not shown) from the area 5 via the contact 13 and the aluminum wiring 12.

Even when positive static electricity occurs at the external input terminal, the input circuit is protected by the protective circuit 1, which operates in the manner described in detail below. The positive static electricity, when transmitted to the $n^+$ type diffusion area 5 from the external input terminal via the aluminum wiring 8, causes a breakdown of the p-n junction of the $n^+$ type diffusion area 5 and the $p^-$ type semiconductor substrate 2. The breakdown passes a current from the $n^+$ type diffusion area 5 to the $p^-$ type semiconductor substrate 2. Since the junction from the $p^-$ type diffusion area 3 to the $n^+$ type diffusion area 4 is a forward p-n junction, the current is passed from the $p^-$ type substrate 2 to the $n^+$ type area 4 via the $p^-$ type area 3. The current then escapes to the low voltage line via the aluminum wiring 10. Accordingly, the positive static electricity is not transmitted to the input circuit via the aluminum wiring 12.

In this embodiment, the $n^+$ type diffusion area 5 is formed directly in the $p^-$ type semiconductor substrate 2 instead of in the $p^-$ type well diffusion area 3. In general, the junction capacitance C of a p-n junction is expressed by the formulas (1) and (2).

The symbols used in the formulas (1) and (2) are as follows;

q: electric charge of electron $1.6 \times 10^{-19}$ coulomb $\epsilon_{s1}$: permittivity of semiconductor 11.9

$\epsilon_0$: permittivity of vacuum $8.85 \times 10^{-14}$ F/cm $N_A$: acceptor impurity concentration (corresponding to the concentration of the substrate or $p^-$ type well)

$N_D$: donor impurity concentration (corresponding to the concentration of $n^+$ type diffusion area)

$\phi$: built-in voltage k: Boltzmann constant $1.38 \times 10^{-23}$ ni: carrier concentration of intrinsic semiconductor In reality, the amount of impurity to be injected to the substrate is controlled so as to cause the value of $N_A$ to be negligible to the value of $N_D$. Therefore the junction capacitance C expressed by the formula (1) can be expressed by an approximation formula (3) of the formula (1), and the built-in voltage $\phi$ expressed by the formula (2) can be expressed by an approximation formula (4).

Thus, provided that the acceptor impurity concentration of the $p^-$ type semiconductor substrate 2 is about one tenth of that of the $p^-$ type well diffusion area 3 in the protective circuit 1 of the first embodiment, the junction capacitance of the $n^+$ type area 5 and $p^-$ type substrate 2 is equal to about one third of the junction capacitance of the $n^+$ type area 4 and $p^-$ type well area 3.

As described above, the protective circuit 1 according to the first embodiment reduces the junction capacitance of the n$^+$ type area 5 and the p$^-$ type substrate 2 without changing the shape of the n$^+$ type diffusion area 5, that is, without reducing the junction area of the n$^+$ type diffusion area 5 and p$^-$ type substrate 2. In other words, the junction capacitance of the n$^+$ type area 5 and the p$^-$ type substrate 2 can be reduced without degrading the tolerance of the protective circuit 1 against static electricity, which occurs at the external input terminal.

Second Embodiment

Figure 4:
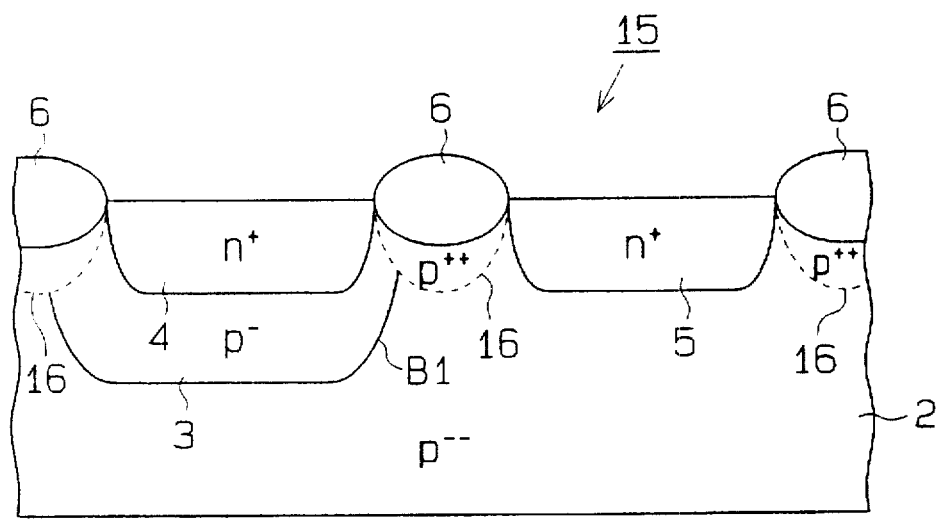
FIG. 4 is a cross-sectional view showing a protective circuit according to a second embodiment of the present invention.

A protective circuit according to the second embodiment of the present invention will now be described referring to FIG. 4. To avoid redundancy, the reference numerals used in this embodiment are like or the same as those of corresponding components of the first embodiment shown in FIGS. 3A and 3B.

A protective circuit 15 formed in an input circuit of a semiconductor device has a relatively high-concentrated p$^{++}$ type channel cut diffusion area 16 underneath the field oxide 6. The channel cut diffusion area 16 is provided between the n$^+$ type diffusion areas 4 and 5.

The channel cut diffusion area 16 is formed by injecting p type impurity into the substrate 2 followed by performing an appropriate thermomigration thereafter. In the process for forming the area 16, silicon nitride film, which is temporary formed on part of the surface of the semiconductor substrate 2 where the diffusion areas 4 and 5 are to be formed, serves as a mask. Accordingly, the process for defining the area 16 at a desired position can be omitted.

The breakdown voltage of the n$^+$ type diffusion area 5 and the channel cut diffusion area 16 is higher than the breakdown voltage of the n$^+$ type area 5 and the p$^-$ type substrate 2. The protective circuit according to the second embodiment has less incidence of leakage current from n$^+$ type area 5 to the n$^+$ type area 4 than the protective circuit according to the first embodiment.

Third Embodiment

Figure 5:
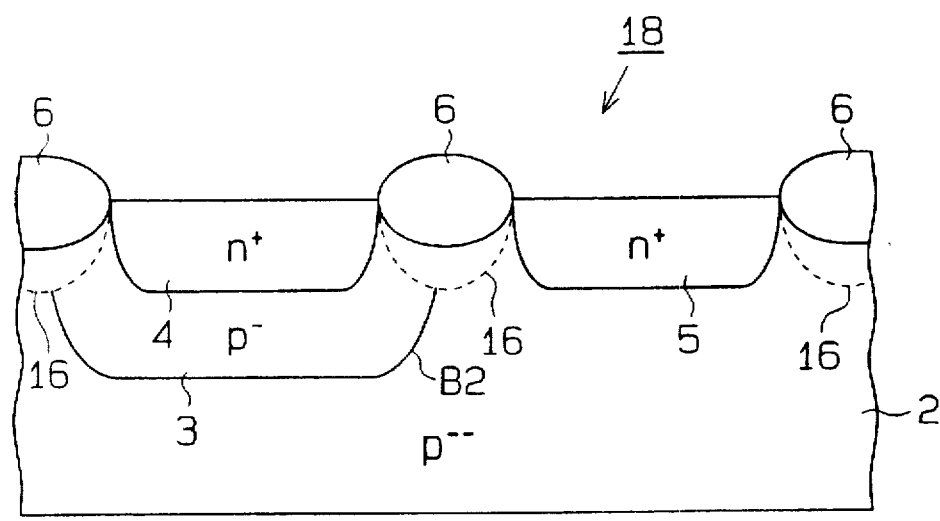
FIG. 5 is a cross-sectional view showing a protective circuit according to a third embodiment of the present invention.

A protective circuit according to the third embodiment of the present invention will now be described referring to FIG. 5. To avoid a redundant description, like or the same reference numerals are given to those components that are the same as the corresponding components of the first and second embodiments.

A protective circuit 18 formed in an input circuit of a semiconductor device has a p$^{++}$ type channel cut diffusion area 16 underneath the field oxide 6. The channel cut diffusion area 16 is provided between the n$^+$ type diffusion areas 4 and 5. The vertical boundary B2 of the well diffusion area 3 and the substrate 2 is located at about the midpoint position between the diffusion areas 4 and 5.

Having the same p$^{++}$ channel cut diffusion area 16 as the protective circuit 15 of the second embodiment, the protective circuit 18 of the third embodiment has the same advantages as the protective circuit 15 of the second embodiment.

In the protective circuit 18, the vertical boundary B2 is located at about the midpoint position between the n$^+$ type diffusion areas 4 and 5. This facilitates the alignment of mask or reticule used in the process of impurity injection for forming the well diffusion area 3 and therefore reduces mask alignment defects. Locating the vertical boundary B2 at about the midpoint position between the diffusion areas 4 and 5 facilitates the control of the thermomigration of p type impurity and therefore reduces the number of defects in the process of manufacturing semiconductor device.

Fourth Embodiment

Figure 6:
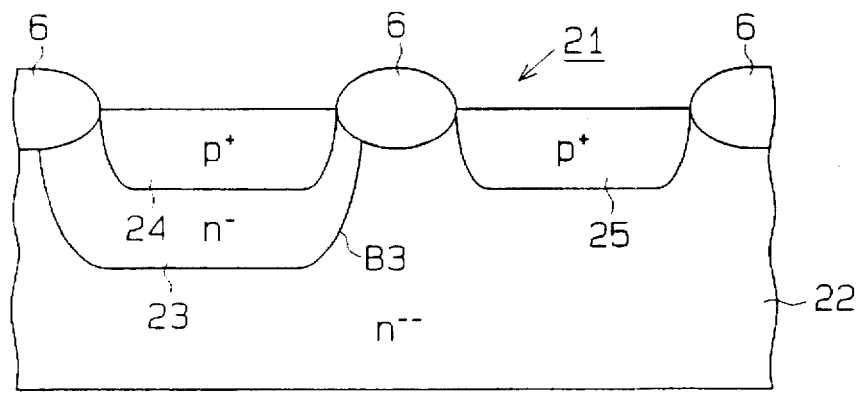
FIG. 6 is a cross-sectional view showing a protective circuit according to a fourth embodiment of the present invention.

A protective circuit according to the fourth embodiment of the present invention will now be described referring to FIG. 6. In a protective circuit 21 of the fourth embodiment, an n$^-$ type well diffusion area 23 as the well diffusion area of the first conductive type is formed in an n$^-$ type semiconductor substrate 22 as the semiconductor substrate of the first conductive type. The concentration of impurity in the well diffusion area 23 is higher than the concentration of impurity in the semiconductor substrate 22.

A p$^+$ type diffusion area 24 is formed in the n$^-$ type well diffusion area 23, while p$^+$ type diffusion area 25 is formed in the n$^-$ type semiconductor substrate 22. The p$^+$ diffusion area 24 serves as the first element of the second conductive type. The p$^+$ diffusion area 25 serves as the second element of the second conductive type. The diffusion areas 24 and 25 are isolated from each other by the field oxide 6 formed on the surface of the substrate 22. The vertical boundary B3 of the well diffusion area 23 and the substrate 22 is located close to the diffusion area 24 below the field oxide 6.

The p$^+$ type diffusion area 25 is coupled to an external input terminal (not shown) and an input circuit (not shown). The p$^+$ type diffusion area 24 is coupled to a low voltage line (not shown). In the fourth embodiment, the p$^+$ type diffusion area 25 and n$^-$ type semiconductor substrate 22 form a p-n junction diode for protecting the input circuit.

In the protective circuit 21, signals at normal voltage, when input to the external input terminal, is transmitted to the input circuit via the p$^+$ type diffusion area 25. When negative static electricity occurs at the external input terminal, the input circuit is protected by the protective circuit 21, which operates in the manner described in detail below. The negative static electricity, when transmitted to the p$^+$ type diffusion area 25 from the external input terminal, causes a breakdown of p-n junction of the p$^+$ type diffusion area 25 and the n$^-$ type semiconductor substrate 22. The breakdown passes the current from the p$^+$ type diffusion area 24 to the p$^+$ type diffusion area 25 via the well diffusion area 23 and the substrate 22. Accordingly, the static electricity is not transmitted to the input circuit. The input circuit is thus protected from the static electricity.

Provided that the acceptor impurity concentration of the n$^-$ type semiconductor substrate 22 is about one tenth of that of the n$^-$ type well diffusion area 23 in the protective circuit 21 of the fourth embodiment, the junction capacitance of the p$^+$ type area 25 and n$^-$ type substrate 22 is equal to about one third of the junction capacitance of the p$^+$ type area 24 and n$^-$ type well area 23.

As described above, the protective circuit 21 according to the fourth embodiment reduces the junction capacitance of the p$^+$ type area 25 and the n$^-$ type substrate 22 without changing the shape of the p$^+$ type diffusion area 25, that is, without reducing the junction area of the p$^+$ type diffusion area 25 and n$^-$ type substrate 22. In other words, the junction capacitance of the p$^+$ type area 25 and the n$^-$ type substrate 22 can be reduced without degrading the tolerance of the protective circuit 21 against the static electricity which occurs at the external input terminal.

Fifth Embodiment

Figure 7:
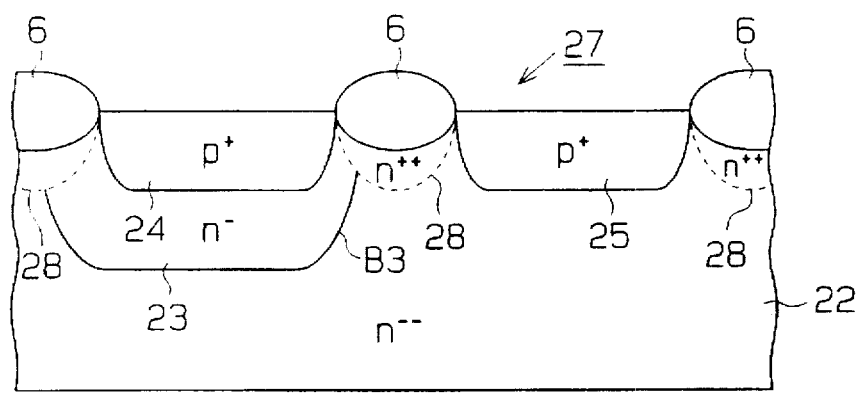
FIG. 7 is a cross-sectional view showing a protective circuit according to a fifth embodiment of the present invention.

A protective circuit according to the fifth embodiment of the present invention will now be described referring to FIG. 7. To avoid redundancy, the reference numerals used in this embodiment are like or the same as those of corresponding components of the fourth embodiment shown in FIG. 6.

A protective circuit 27 formed in an input circuit of a semiconductor device has a relatively high-concentrated n$^{++}$ type channel cut diffusion area 28 underneath the field oxide 6. The channel cut diffusion area 28 is provided between a pair of p$^+$ type diffusion areas 24 and 25.

In the process for forming the channel cut area 28, silicon nitride film, which is temporarily formed on part of the surface of the substrate 22 where the p$^+$ type diffusion areas 24 and 25 are to be formed for the purpose of forming the field oxide 6, serves as a mask. Accordingly, the process for defining the area 28 at a desired position can be omitted.

The breakdown voltage of the p$^+$ type diffusion area 25 and the channel cut diffusion area 28 is higher than the breakdown voltage of the p$^+$ type area 25 and the n$^-$ type substrate 22. The protective circuit 27 according to the fifth embodiment has less leakage of current from p$^+$ type diffusion area 25 to the p$^+$ type diffusion area 24 than the protective circuit according to the fourth embodiment.

Sixth Embodiment

Figure 8:
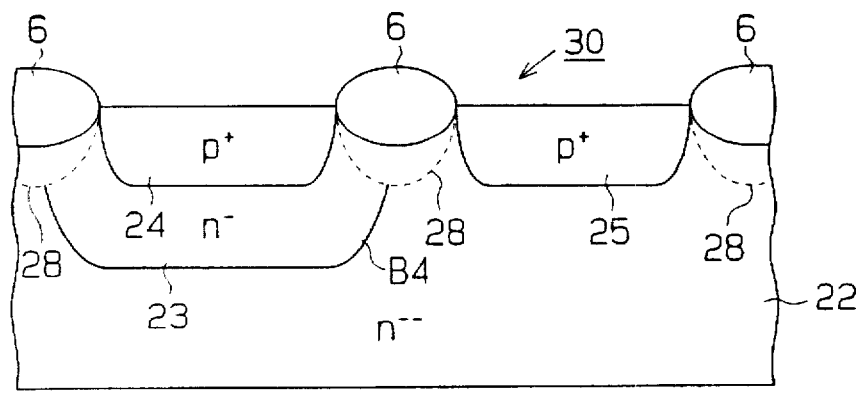
FIG. 8 is a cross-sectional view showing a protective circuit according to a sixth embodiment of the present invention.

A protective circuit according to the sixth embodiment of the present invention will now be described referring to FIG. 8. To avoid redundancy, the reference numerals used in this embodiment are like or the same as those of corresponding components of the protective circuit shown in FIG. 6.

A protective circuit 30 formed in an input circuit of a semiconductor device has an n$^{++}$ type channel cut diffusion area 28 underneath the field oxide 6. The channel cut diffusion area 28 is provided between the p$^+$ type diffusion areas 24 and 25. The vertical boundary B4 of the well diffusion area 23 and the substrate 22 is located at about the midpoint position between the diffusion areas 24 and 25.

Having the same n$^{++}$ channel cut diffusion area 28, the protective circuit 30 of the sixth embodiment has the same advantages as the protective circuit 27 of the fifth embodiment. In the protective circuit 30, the vertical boundary B4 is located at about the midpoint position between the p$^+$ type diffusion areas 24 and 25. This facilitates the alignment of mask or reticle used in the process of impurity injection for forming the well diffusion area 23 and therefore reduces mask alignment defects. Locating the vertical boundary B4 at about the midpoint position between the diffusion areas 24 and 25 facilitates the control of the thermomigration of n type impurity and therefore reduces the number of defects in the process of manufacturing semiconductor devices.

Seventh embodiment

The seventh embodiment of the present invention will now be described referring to FIG. 9. To avoid redundancy, the reference numerals used in this embodiment are like or the same as those of corresponding components shown in FIG. 5.

Figure 9:
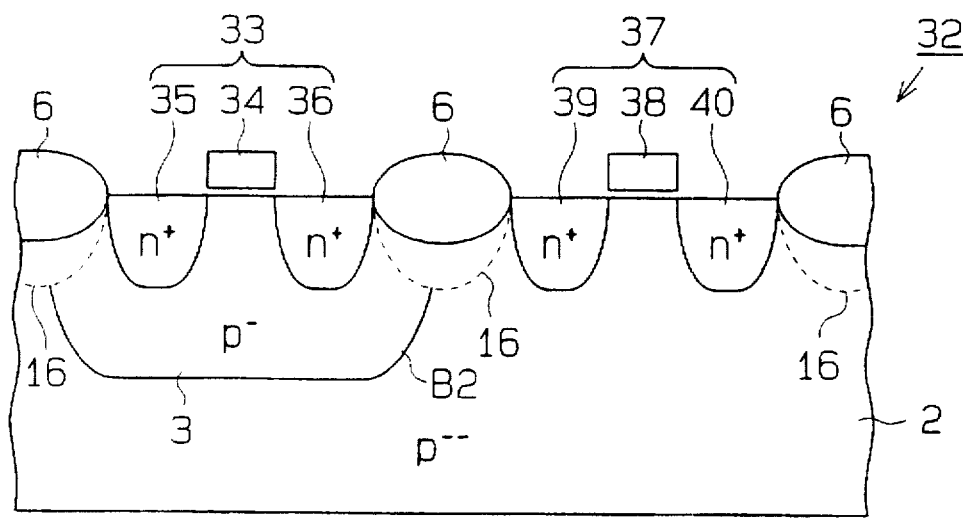
FIG. 9 is a cross-sectional view showing a semiconductor device according to a seventh embodiment of the present invention.

FIG. 9 shows an nMOS transistor part forming an internal circuit of a semiconductor device 32 according to the seventh embodiment. An nMOS transistor 33 as the first element is formed in the p$^-$ type well diffusion area 3, while an nMOS transistor 37 as the second element is formed in the p$^-$ type semiconductor substrate 2. The nMOS transistor 33 consists of a gate 34 and a pair of n$^+$ type diffusion areas 35 and 36. The nMOS transistor 37 consists of a gate 38 and a pair of n$^+$ type diffusion areas 39 and 40. The nMOS transistors 33 and 37 are isolated from each other by the field oxide 6. In FIG. 9, the insulation, formed on the surface of the semiconductor device 32, is not illustrated.

A p$^{++}$ type channel cut diffusion area 16 is formed underneath the field oxide 6 between the nMOS transistors 33 and 37. The vertical boundary B2 of the well diffusion area 3 and the substrate 2 is located at about the midpoint position between the nMOS transistors 33 and 37.

In this semiconductor circuit 32, the nMOS transistor 37 is formed directly in the p$^-$ type substrate 2. Because of this, the threshold voltage of the nMOS transistor 37 tends to vary. The nMOS transistor 37 of this embodiment reduces the junction capacitance of the n$^+$ type diffusion areas 39 and 40 and the p$^-$ type semiconductor substrate 2 while maintaining the conductance and load driving capability of the transistor 37 without reducing the junction area of the areas 39 and 40 and the semiconductor substrate 2. The semiconductor circuit 32 of this embodiment, when provided in a transfer gate, which operates regardless of the variation of the threshold voltage of nMOS transistors provided therein, accelerates the operation speed of the device.

Eighth Embodiment

The eighth embodiment of the present invention will now be described referring to FIG. 10. To avoid redundancy, the reference numerals used in this embodiment are like or the same as those of corresponding components shown in FIG. 9.

Figure 10:
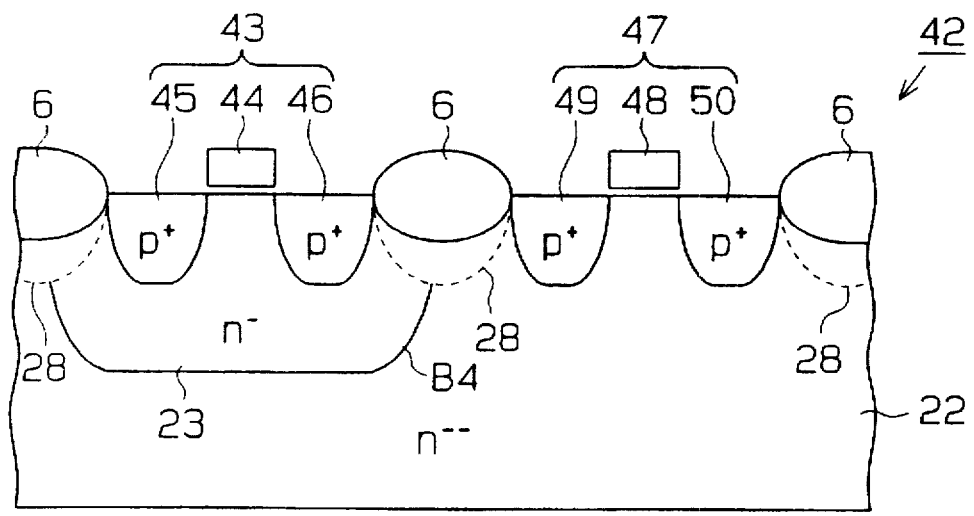
FIG. 10 is a cross-sectional view showing a semiconductor device according to an eighth embodiment of the present invention.

FIG. 10 shows a pMOS transistor part forming an internal circuit of a semiconductor device 42 according to the eighth embodiment. A pMOS transistor 43 as the first element is formed in the n$^-$ type well diffusion area 23, while a pMOS transistor 47 as the second element is formed in the n$^-$ type semiconductor substrate 22. The pMOS transistor 43 consists of a gate 44 and a pair of p$^+$ type diffusion areas 45 and 46. The pMOS transistor 47 consists of a gate 48 and a pair of p$^+$ type diffusion areas 49 and 50. The pMOS transistors 43 and 47 are isolated from each other by the field oxide 6. In FIG. 10, the insulation, formed on the surface of the semiconductor device 42, is not illustrated.

An n$^{++}$ type channel cut diffusion area 28 is formed underneath the field oxide 6 between the pMOS transistors 43 and 47. The vertical boundary B4 of the well diffusion area 23 and the substrate 22 is located at about the midpoint position between the pMOS transistors 43 and 47.

In this semiconductor circuit 42 of the eighth embodiment, the pMOS transistor 47 is formed directly in the n$^-$ type substrate 22. Because of this, the threshold voltage of the pMOS transistor 47 tends to vary. The pMOS transistor 47 of this embodiment, however, reduces the junction capacitance of the p$^+$ type diffusion areas 49 and 50 and the n$^-$ type semiconductor substrate 22 while maintaining the conductance and load driving capability of the transistor 47 without reducing the junction area of the areas 49 and 50 and the semiconductor substrate 22. The semiconductor circuit 42 of this embodiment, when provided in a transfer gate, which operates regardless of the variation of the threshold voltage of pMOS transistors provided therein, accelerates the operation speed of the device.

Although several embodiments of the present invention have been described herein, it should be apparent to those skilled in the art that the present invention may be embodied in many other specific forms without departing from the spirit or scope of the invention. Particularly, the invention may be embodied in the following forms:

The p$^{++}$ type channel cut diffusion area 16 in the protective circuit 18 in the third embodiment can be omitted. The p$^{++}$ type channel cut diffusion area 16 in the semiconductor device 32 in the seventh embodiment can be omitted. The n$^{++}$ type channel cut diffusion area 28 in the protective circuit 30 in the sixth embodiment can be omitted. The n$^{++}$ type channel cut diffusion area 28 in the semiconductor device 42 in the eighth embodiment can be omitted.

Therefore, the present examples and embodiments are to be considered as illustrative and not restrictive and the $$C = \sqrt{\frac{q \times \epsilon_{Si} \times \epsilon_0}{2} \times \frac{N_A \times N_D}{N_A + N_D} \times \frac{1}{\phi - V}} \quad (1)$$

$$= \sqrt{\frac{q \times \epsilon_{Si} \times \epsilon_0}{2} \times \frac{N_A}{N_A/N_D + 1} \times \frac{1}{\phi - V}}$$

$$\phi = \frac{kT}{q} \times \ln\frac{N_A \times N_D}{n_i^2} \quad (2)$$

$$= \frac{kT}{q} \times \left( \ln\frac{N_A}{n_i^2} + \ln\frac{N_D}{n_i^2} \right)$$

$$C \approx \sqrt{\frac{q \times \epsilon_{Si} \times \epsilon_0 \times N_A}{2} \times \frac{1}{\phi - V}} \quad (3)$$

$$\phi \approx \frac{kT}{q} \times \ln\frac{N_D}{n_i^2} \quad (4)$$

What is claimed is:

1. A semiconductor circuit device comprising:
   a semiconductor substrate of a first conductivity type;
   a well area formed on said substrate; said well area being of said first conductivity type as said substrate and having higher concentration of impurity than that of said substrate;
   a first element formed in said well area; said first element being of a second conductivity type different from said first conductivity type;
   a second element of said second conductivity type formed in said substrate; and
   a field oxide located between said first element from said second element,
   wherein a channel cut diffusion area is formed below said field oxide between said first element and said second element, and wherein a substantially vertical boundary of said well area and said substrate is located below said field oxide at about the midpoint position between said first element and said second element.

2. A semiconductor circuit device comprising:
   a semiconductor substrate of a first conductivity type;
   a well area formed in said substrate; said well area being of said first conductivity type as said substrate and having higher concentration of impurity than that of said substrate and having higher concentration of impurity than that of said substrate; and
   a first element formed in said well area; said first element being of a second conductivity type different from said first conductivity type;
   a second element of said second conductivity type formed in said substrate;
   wherein said second element is coupled to an external input terminal and an input circuit; and wherein said second element and said semiconductor substrate form a p-n junction diode for protecting said input circuit from static electricity.

3. The semiconductor circuit device according to claim 1, wherein each of said first element and said second element is an nMOS transistor.

4. The semiconductor circuit device according to claim 1, wherein each of said first element and said second element is a pMOS transistor.

5. A semiconductor circuit device comprising:
   a p-type semiconductor substrate having a first impurity concentration;
   a p-type well region selectively formed in said p-type semiconductor substrate and having a second impurity concentration;
   a first n-type diffusion region formed in said well region and coupled to a ground potential; and
   a second n-type diffusion region formed in said p-type semiconductor substrate and coupled to an input terminal and an input circuit;
   wherein positive static electricity, which is applied to said input terminal, flows to said ground potential through said second n-type diffusion region, said p-type semiconductor substrate, said p-type well region and said first n-type diffusion region such that said input circuit is protected from positive static electricity.

* * * * *